United States Patent
Liang et al.

(10) Patent No.: US 7,307,450 B2
(45) Date of Patent: Dec. 11, 2007

(54) PROGRAMMABLE LOGIC BLOCK FOR DESIGNING AN ASYNCHRONOUS CIRCUIT

(75) Inventors: Fang-Jia Liang, Taipei (TW); Fu-Chiung Cheng, Taipei (TW)

(73) Assignees: Tatung Company, Taipei (TW); Tatung University, Taipei (TW)

( * ) Notice: Subject to any disclaimer, the term of this patent is extended or adjusted under 35 U.S.C. 154(b) by 161 days.

(21) Appl. No.: 11/171,217

(22) Filed: Jul. 1, 2005

(65) Prior Publication Data

US 2006/0001445 A1 Jan. 5, 2006

(30) Foreign Application Priority Data

Jul. 2, 2004 (TW) .............. 93120021 A

(51) Int. Cl.
*G06F 7/38* (2006.01)
(52) U.S. Cl. .............. 326/39; 326/37; 326/38; 326/40; 326/41; 326/47
(58) Field of Classification Search ............ 326/37–41, 326/47
See application file for complete search history.

(56) References Cited

U.S. PATENT DOCUMENTS

| | | | | |
|---|---|---|---|---|
| 5,386,156 A * | 1/1995 | Britton et al. | ................ | 326/37 |
| 5,815,003 A * | 9/1998 | Pedersen | ................ | 326/39 |
| 5,905,385 A * | 5/1999 | Sharpe-Geisler | ............ | 326/39 |
| 6,020,756 A * | 2/2000 | New | ............ | 326/39 |
| 6,107,822 A * | 8/2000 | Mendel et al. | ................ | 326/39 |
| 6,271,680 B1 * | 8/2001 | Mendel et al. | ................ | 326/40 |
| 6,292,019 B1 * | 9/2001 | New et al. | ................ | 326/41 |
| 6,359,469 B1 * | 3/2002 | Mendel et al. | ................ | 326/40 |
| 6,750,674 B1 * | 6/2004 | Kundu et al. | ................ | 326/38 |
| 6,958,627 B2 * | 10/2005 | Singh et al. | ................ | 326/93 |
| 7,075,333 B1 * | 7/2006 | Chaudhary et al. | ........... | 326/38 |
| 7,109,765 B1 * | 9/2006 | Wang et al. | ................ | 327/156 |
| 7,119,575 B1 * | 10/2006 | Schleicher et al. | ........... | 326/41 |
| 7,126,381 B1 * | 10/2006 | Schmit et al. | ............. | 326/101 |
| 2004/0041584 A1 * | 3/2004 | Sunaga et al. | ................ | 326/38 |

* cited by examiner

*Primary Examiner*—Vibol Tan
*Assistant Examiner*—Matthew C Tabler
(74) *Attorney, Agent, or Firm*—Bacon & Thomas, PLLC

(57) ABSTRACT

A programmable logic block for an asynchronous circuit design is disclosed. After a programmable setup, the logic block not only has the processing function of common devices, but also communicates using the asynchronous protocol so as to design an asynchronous device.

18 Claims, 14 Drawing Sheets

PROGRAMMABLE LOGIC BLOCK FOR DESIGNING AN ASYNCHRONOUS CIRCUIT

BACKGROUND OF THE INVENTION

1. Field of the Invention

The present invention relates to a programmable logic block, and more particularly to a programmable logic block suitable for designing an asynchronous circuit.

2. Description of Related Art

Recently, due to a huge demand for electronic chips and time taken to meet the market requirement, the field programmable grate array (FPGA) has become an optimum choice for circuit design. The architecture of the FPGA is primarily categorized into the SRAM-base model and the anti-fuse model in the design. The SRAM-base is featured by rewritability, low power consumption and in-circuit configurability, but it requires download of data from the external device and an external power source to maintain data. Thus, the SRAM-base is adapted to a multiple-writing circuit design. On the other hand, the anti-fuse has a one-time programmable (OTP) feature to provide better protection for security, but it is unable to be further modified. Thus, the anti-fuse is adapted to a write-once circuit design. Nevertheless, the industry currently does not provide any FPGA system designed specifically for the asynchronous protocol because the asynchronous circuit is complex and not easy to design. The industry does not have either a comprehensive set of design flows or appropriate software for the use of engineers. As such, an asynchronous circuit system design using the FPGA system will involve a number of useless circuits, causing waste of chip area and inefficiency. Therefore, the aforementioned FPGA system has some defects in the process of asynchronous circuit design, and thus needs to be improved.

SUMMARY OF THE INVENTION

The object of the present invention is to provide a programmable logic block so as to accelerate the development of asynchronous circuit system design, and increase the convenience, accuracy and efficiency of the asynchronous circuit design.

To achieve the object, a programmable logic block according to the present invention provides a predetermined logic processing function and has at least an external input signal inputted to cause a predetermined logic processing and output of at least an external output signal. The programmable logic block comprises at least a first programmable logic block outputting a first output signal in accordance with a first look-up table and at least one first input signal; a second programmable logic block outputting a second output signal in accordance with a second look-up table and at least one second input signal; an inverter for receiving the external input signal and outputting an inverted external input signal; at least one first logic AND gate for inputting the first input signal and the inverted external input signal and outputting the external input signal; at least a first multiplexer for outputting the first input signal selected from the external input signal and the external output signal in accordance with a first predetermined signal; a second multiplexer for outputting the first input signal selective from the external input signal and the external output signal in accordance with a second predetermined signal; a second logic AND gate for inputting the second input signal and the inverted external input signal and outputting the external output signal; wherein the external input signal serves as the first input signal and the external output signal serves as the second input signal.

Accordingly, the logic block is capable of providing the user with a circuit of any specific function by modifying the contents of the first and the second look-up tables and the predetermined values of the first and the second multiplexers so that the object of the present invention is achieved by the logic block.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
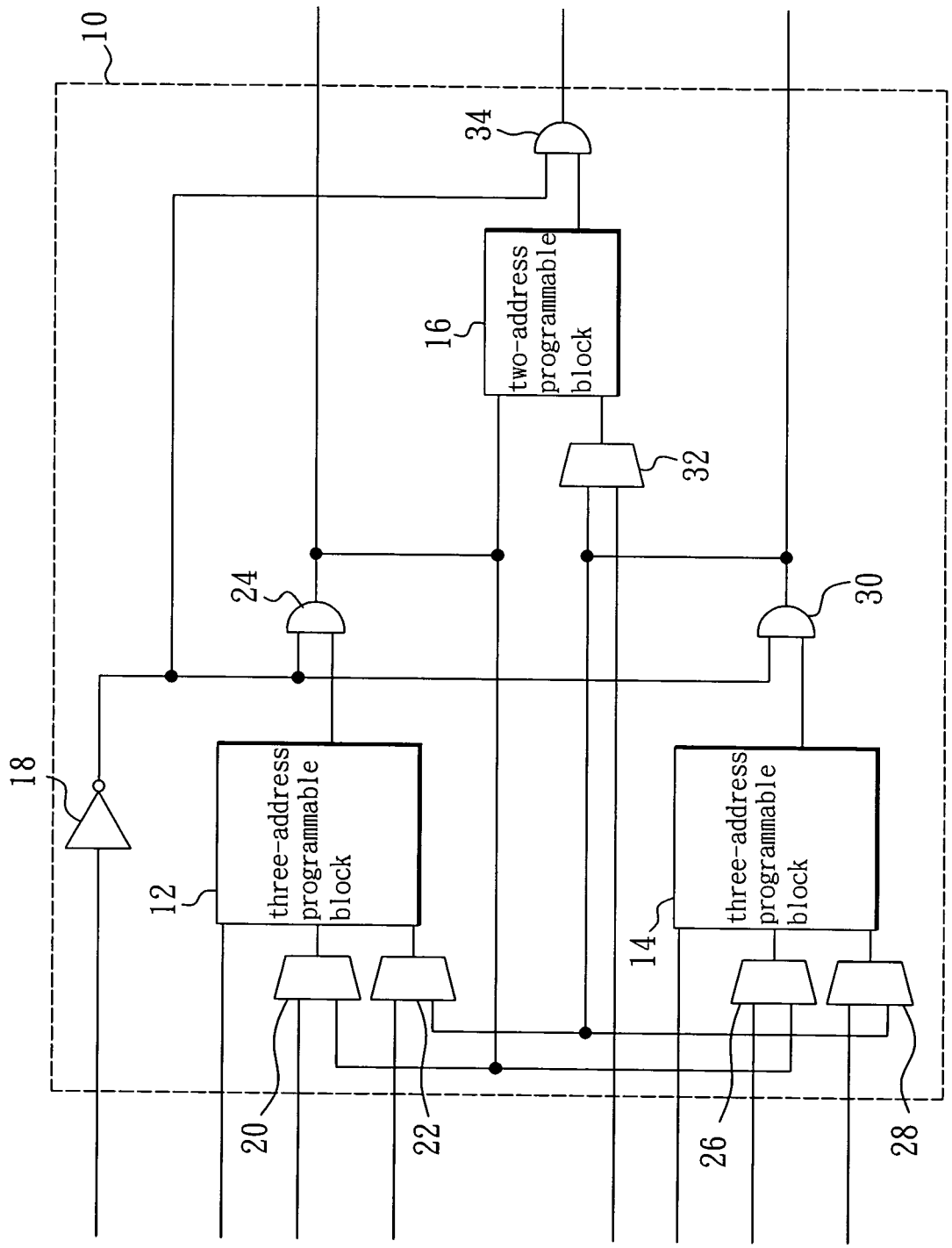
FIG. 1 is a schematic view of a programmable logic block according to the present invention.

FIG. 1 shows a schematic view of a programmable logic block 10 according to the present invention. The programmable logic block 10 provides various logic processes in accordance with different setups. After the logic function of the programmable logic block 10 is determined, implementation is effected by an SRAM-base or anti-fuse. In addition, the logic processing proceeds in an asynchronous manner. As such, the programmable logic block 10 not only can be used in the design or combination of asynchronous electronic devices but also can simplify wires and testing steps required for asynchronous electronic device design.

The programmable logic block 10 is composed of the following electronic devices: two three-address programmable blocks 12 and 14, a two-address programmable block 16, an inverter 18, a plurality of multiplexers 20, 22, 26, 28 and 32, and logic AND gates 24, 30 and 34. The three-address programmable blocks 12, 14 and the two-address programmable block 16 respectively store a look-up table of which contents are modifiable so that the programmable logic block 10 can be served as an electronic device of different logic functions including Muller-C element, toggle element, two-to-four phase converter or four-to-two phase converter used usually for asynchronous circuit design.

In setting up different logic functions, external input signals inputted to the programmable logic block 10 can be different, in number, from external output signals, depending on the needs in practice. For example, in the case of the programmable logic block 10 serving as the toggle element, there are two external input signals and two external output signals. In the case of serving as a two-to-four phase converter, there are three external input signals and two external output signals.

In the case where the programmable logic block 10 serves as an electronic device of different functions, a combination can be made subject to the requirement in practice. In the case of the electronic device partly having simple functions, a single programmable logic block 10 is provided to function as two electronic devices; for example, the single programmable logic block 10 performs two independent Muller-C elements. In the case of the electronic device partly having complex functions, a combination of the logic blocks 10 is provided; for example, two logic blocks 10 are combined to provide an electronic device performing a condition converter function.

Figure 2:
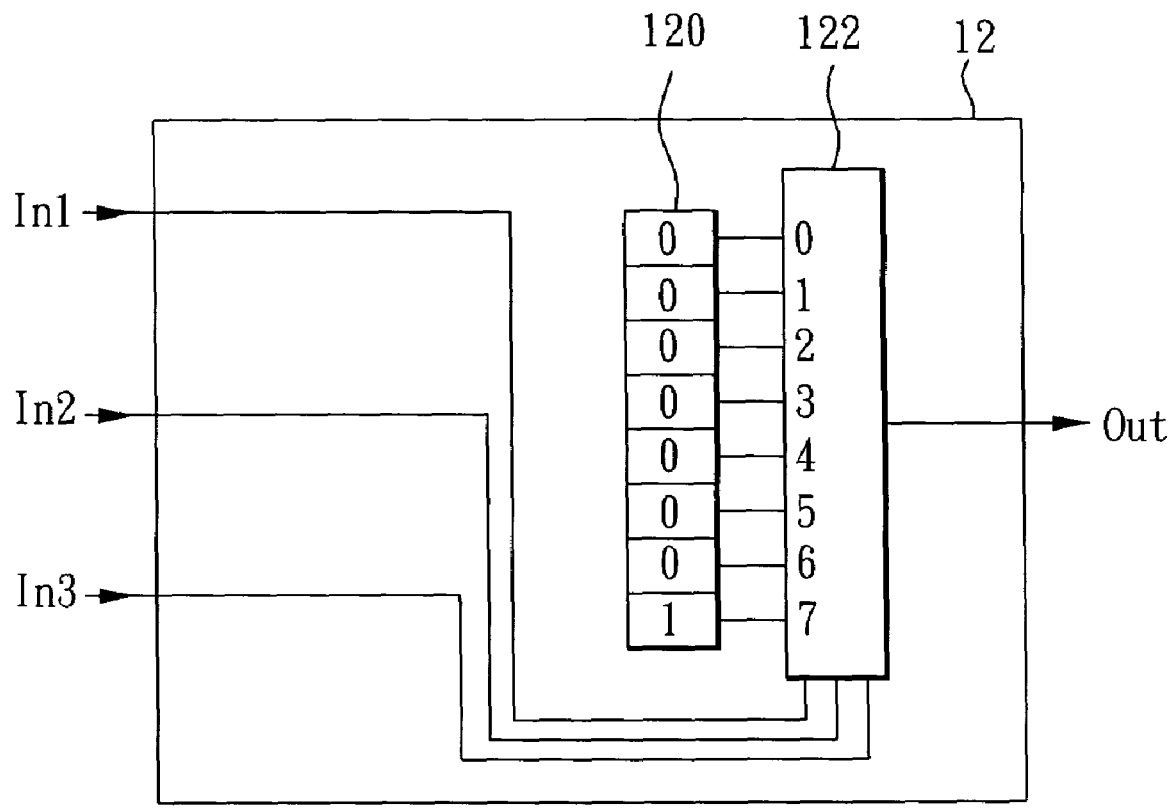
FIG. 2 is a schematic view of a three-address programmable logic block.

FIG. 2 shows an exemplified architecture of a three-address programmable block 12 that consists of a memory unit 120 and a multiplexer 122. Because the three-address programmable block 12 has three input signals, which are In1, In2 and In3 from top to bottom, the multiplexer 122 is a three-to-eight multiplexer, and also, the memory unit 120 stores eight data which are 0, 0, 0, 0, 0, 0, 0, 1 from top to bottom, so as to output corresponding data Out in accordance with the input signals enabled to the multiplexer 122.

| In3 | In2 | In1 | Address | Out |
|---|---|---|---|---|
| 0 | 0 | 0 | 0 | 0 |
| 1 | 0 | 0 | 1 | 0 |
| 0 | 1 | 0 | 2 | 0 |
| 1 | 1 | 0 | 3 | 0 |
| 0 | 0 | 1 | 4 | 0 |
| 1 | 0 | 1 | 5 | 0 |
| 0 | 1 | 1 | 6 | 0 |
| 1 | 1 | 1 | 7 | 1 |

When the input signals correspond to addresses 0 to 6, the output signals are all set to "0". When the input signal corresponds to address 7 (namely, three input signals are all "1"), the output signal is set to "1". As a result, the logic calculation is identical to that of a three-input AND gate. If the data stored in the memory unit 120 is changed to become 0, 1, 1, 1, 1, 1, 1, 1, the logic calculation will be identical to that of a three-input OR gate. Under the circumstances, the three-address programmable block 12 is capable of providing different logic calculating function by modifying the data stored in the memory unit 120. On the other hand, the internal architecture of both the three-address programmable block 14 and the two-address programmable block 16 is similar to that of the three-address programmable block 12 (thus a detailed description is deemed unnecessary), except the two-address programmable block 16 has only two input signals and four data in the look-up table. Each of the multiplexers 20, 22, 26, 28, 32 has two input signals, which are a first input signal and a second input signal from top to bottom, a predetermined value and an output signal. If the predetermined value is set to "0", the first input signal is the output signal. If the predetermined value is set to "1", the second input signal is the output signal.

It is known from the above description that the programmable logic block 10 is capable of providing an electronic device of different functions by modifying the look-up table. In the following description, electronic devices used usually in the art are exemplified without any limitation thereto.

Toggle Element

Figure 3:
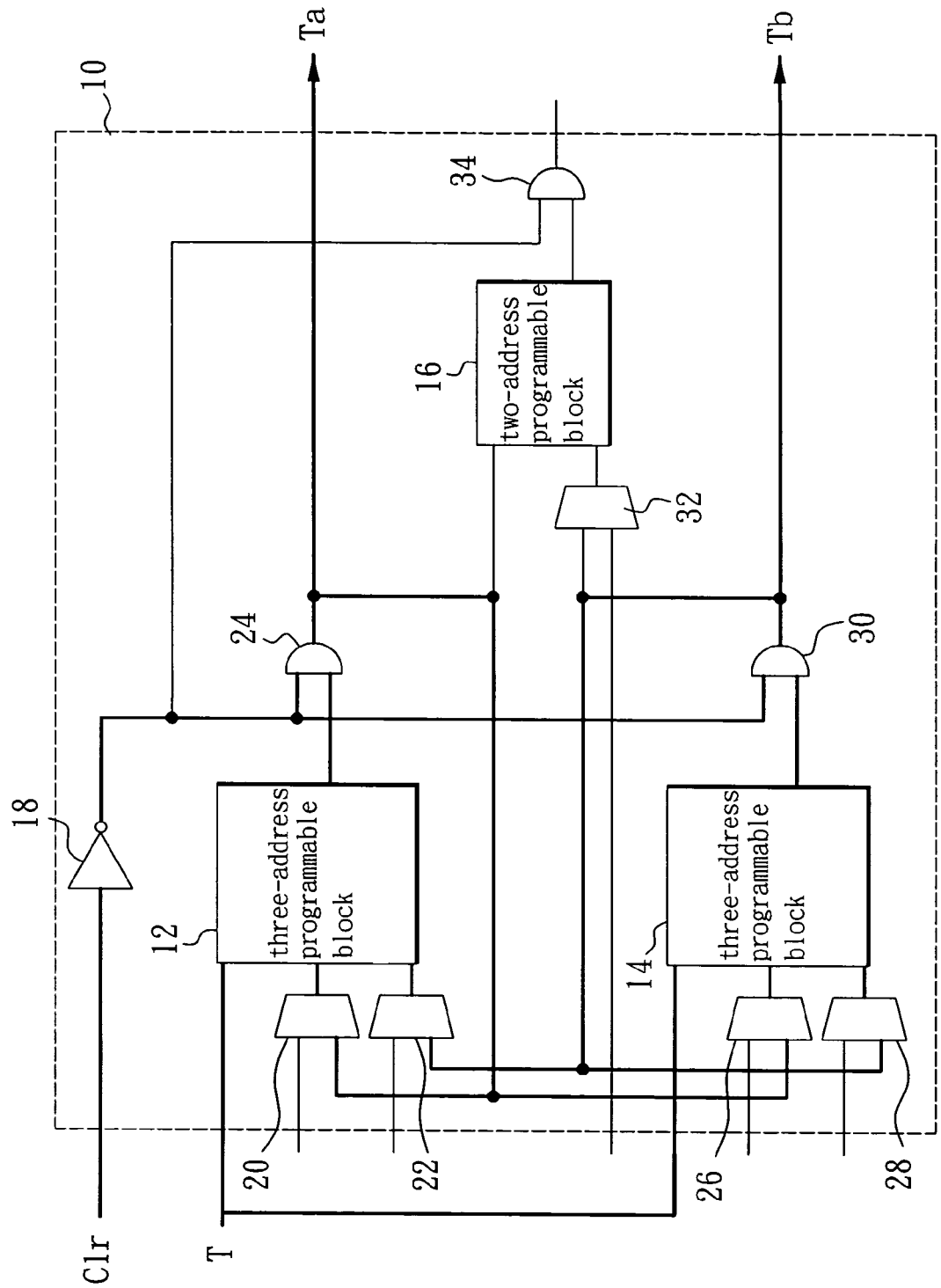
FIG. 3 is a schematic view of a programmable logic block having a toggle element.

As shown in FIG. 3, the function of toggle element is to change an output signal in accordance with the rising edge or the falling edge of an input signal. In the design of a programmable logic block 10, an output signal Ta is changed in accordance with the rising edge of an input signal T while an output signal Tb is changed in accordance with the falling edge of the input signal T.

A three-address programmable block 12, a three-address programmable block 14 and a two-address programmable block 16 store a first look-up table, a second look-up table and a third look-up table, respectively. The contents of the look-up tables are as follows.

| Address | First look-up table | Second look-up table | Third look-up table |
|---|---|---|---|
| 0 | 0 | 0 | X |
| 1 | 1 | 0 | X |
| 2 | 1 | 1 | X |
| 3 | 1 | 0 | X |
| 4 | 0 | 0 | |
| 5 | 0 | 1 | |
| 6 | 1 | 1 | |
| 7 | 0 | 1 | |

Figure 4:
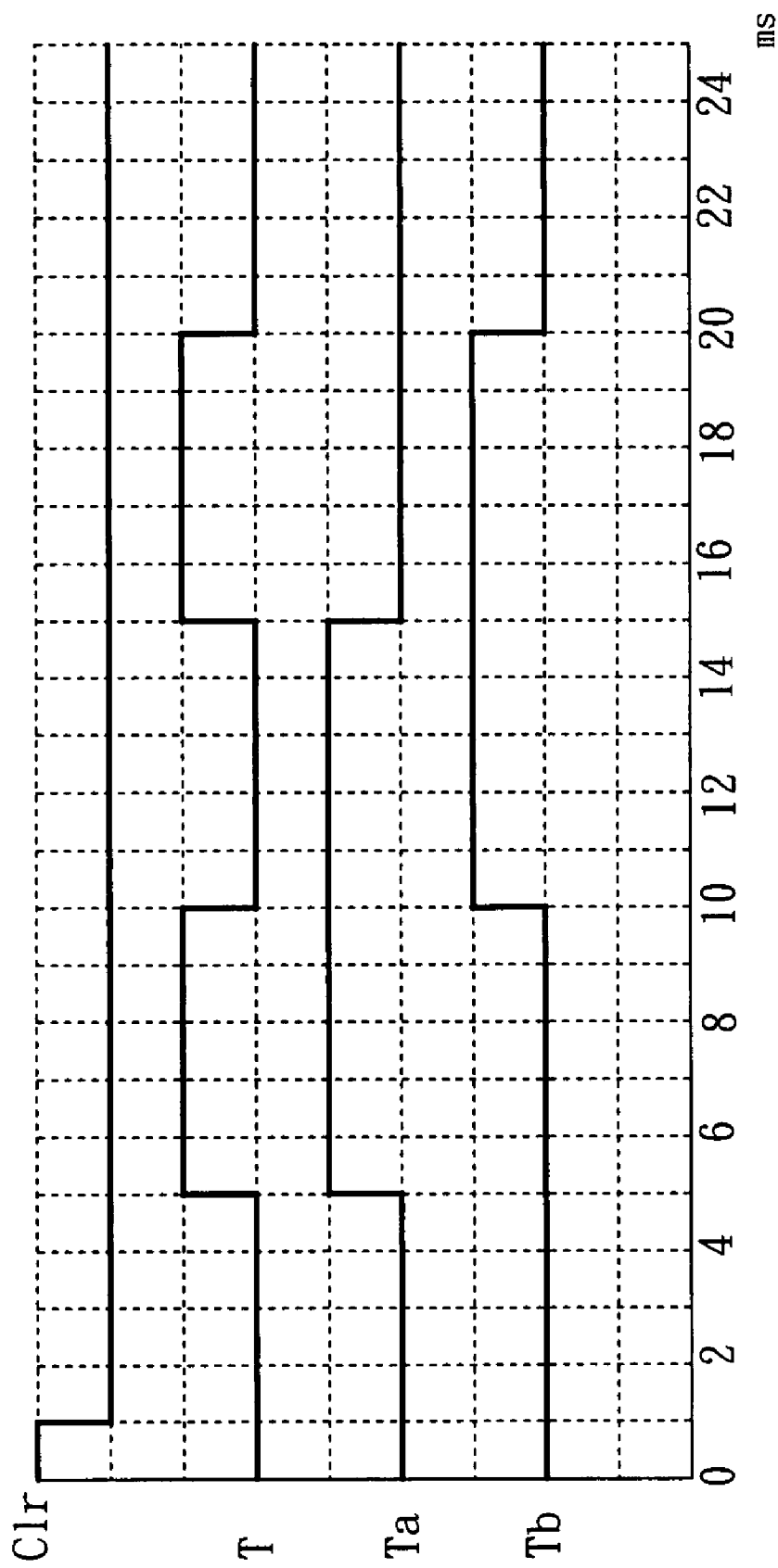
FIG. 4 is a timing diagram of the programmable logic block of FIG. 3.

On the other hand, the predetermined values of multiplexers 20, 22, 26, 28 and 32 are 1, 1, 1, 1 and x for any value, respectively. Circuit lines in bold are active wirings while circuit lines in fine are inactive wirings. FIG. 4 shows a timing diagram of this programmable logic block 10, in which an initialization starts (triggered by a signal "CLR") during the first millisecond to have an input signal T of "0", an output of "0" from the three-address programmable logic block 12, an output of "0" from the three-address programmable logic block 14, an output signal Ta of "0" and an output signal Tb of "0 ". During the fifth millisecond, there are an output signal T of "1" and output of "1" from the three-address programmable block 12 (corresponding to address 1 of the look-up table); and then, after feedback processing (the corresponding address of the look-up table is changed to 3), there are an output signal Ta of "1" and an output of "0" from the three-address programmable block 14 (the corresponding address of the look-up table is changed from 1 to 3). As a result, there is an output signal Tb of "0". During the tenth millisecond, there is an input signal T of "0" so that an output of "1" from the three-address programmable block 12 (corresponding address 2 of the look-up table) results in an output signal Ta of "1" and that output of "1" from the three-address programmable block 14 (the corresponding address of the look-up table is changed from 2 to 6) results in an output signal Tb of "1". During the fifteenth millisecond, there is an input signal T of "1" so that an output of "0" from the three-address programmable block 12 (the corresponding address of the look-up table is changed from 7 to 5) results in an output signal Ta of "0" and that an output of "1" from the three-address programmable block 14 (the corresponding address of the look-up table is changed from 7 to 5) results in an output signal Tb of "1". During the twentieth millisecond, there is an input signal T of "0" so that an output of "0" from the three-address programmable block 12 (the corresponding address of the look-up table is changed from 4 to 0) results in output signal Ta of "0" and that an output of "0" from the three-address programmable block 14 (the corresponding address of the look-up table is changed from 4 to 0) results in an output signal Tb of "0". Hence, the programmable logic block 10 is capable of providing the function of the Toggle element by modifying the look-up tables.

Muller-C Element

Figure 5:
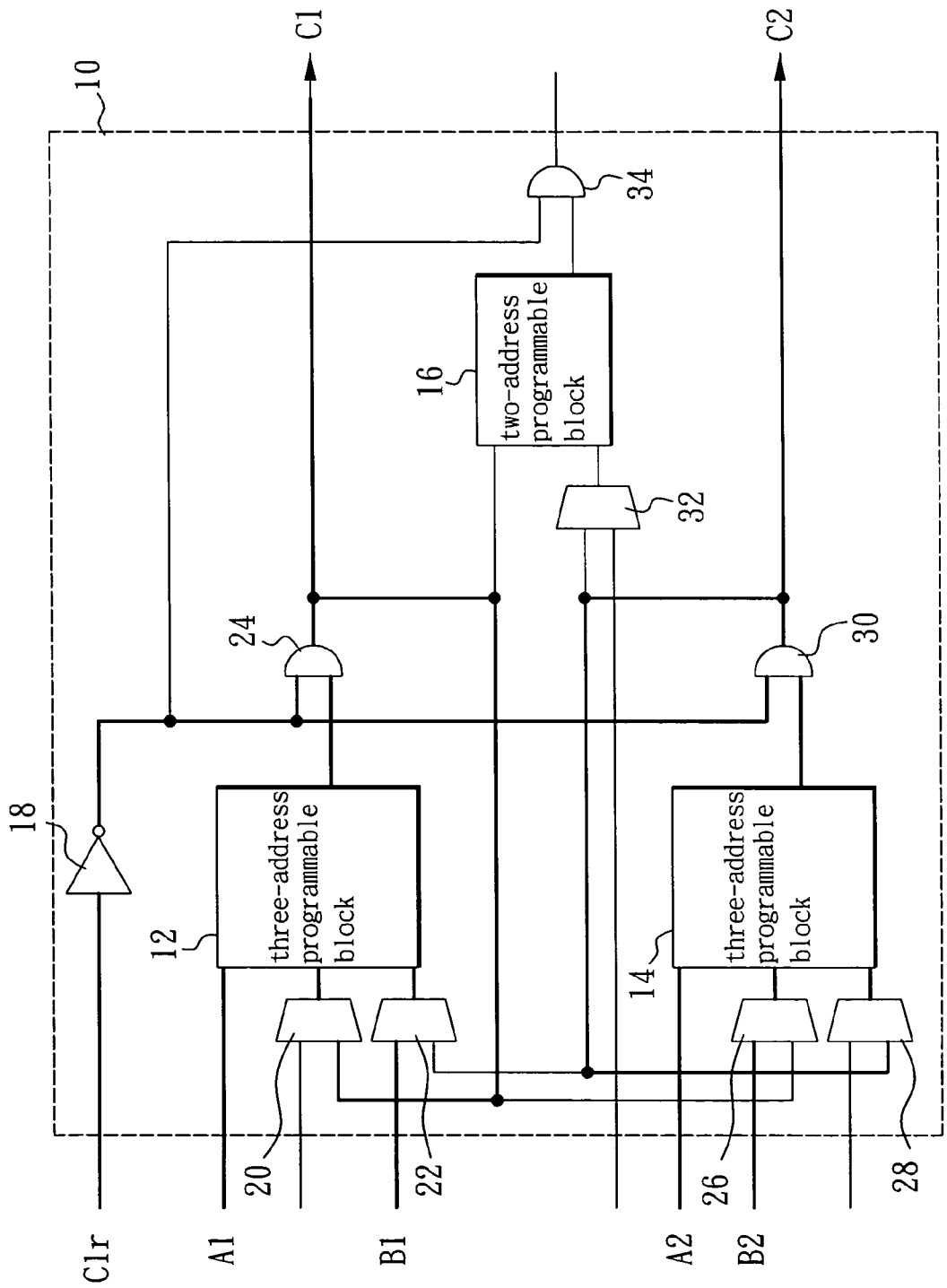
FIG. 5 is a schematic view of a programmable logic block having two Muller-C elements.

As shown in FIG. 5, the function of the Muller-C element is to synchronize signals, having logic operation as follows: in the case of both input signals of "1", there are output signals of "1"; or in the case of both input signals of "0", there are output signals of "0"; or in the case of the other two input signals different, the output signals remain unchanged.

A three-address programmable block 12, a three-address programmable block 14 and a two-address programmable block 16 store a first look-up table, a second look-up table and a third look-up table, respectively. The contents of the look-up tables are as follows.

| Address | First look-up table | Second look-up table | Third look-up table |
| --- | --- | --- | --- |
| 0 | 0 | 0 | X |
| 1 | 0 | 0 | X |
| 2 | 0 | 0 | X |
| 3 | 1 | 1 | X |
| 4 | 0 | 0 | |
| 5 | 1 | 1 | |
| 6 | 1 | 1 | |
| 7 | 1 | 1 | |

Figure 6:
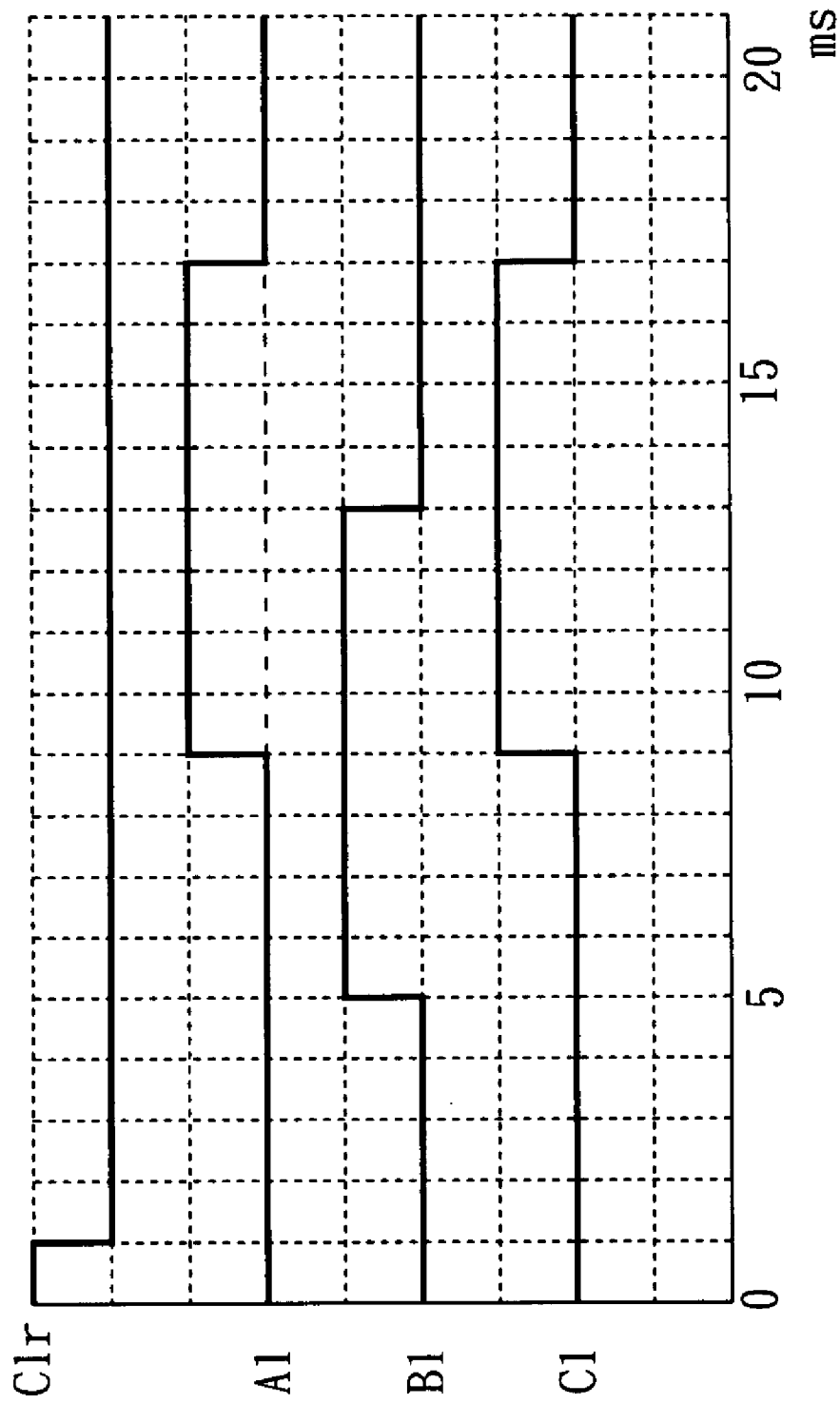
FIG. 6 is a timing diagram of the programmable logic block of FIG. 5.

On the other hand, the predetermined value of multiplexers 20, 22, 26, 28 and 32 are 1, 0, 0, 1 and x, respectively. Because the Muller-C element is of a simple architecture, two Muller-C elements are used to form a single programmable logic block 10, in which circuit lines in bold are active while circuit lines in fine are inactive. FIG. 6 shows a timing diagram of this programmable logic block 10. During the first millisecond, there are respectively an input signal A1 of "0", an input signal B1 of "0" and an output of "0" from the three-address programmable logic 12 so as to result in an output signal C1 of "0". During the fifth millisecond, there are an input signal A1 of "0", an input signal B1 of "1", and an output of "0" from the three-address programmable logic 12 (corresponding to address 1 of the look-up table) so as to result in an output signal C1 of "0". During the ninth millisecond, there are an input signal A1 of "1", an input signal B1 of "1", and an output of "0" from the three-address programmable logic 12 (the corresponding address of the look-up table is changed from 5 to 7) so as to result in an output signal C1 of "1". During the thirteenth millisecond, there are an input signal A1 of "1", an input signal B1 of "0" and an output of "1" from the three-address programmable logic 12 (corresponding to address 6 of the look-up table) so as to result in an output signal C1 of "1". During the seventeenth millisecond, there are an input signal A1 of "0", an input single B1 of "0", and an output of "1" from the three-address programmable logic 12 (the corresponding address of the look-up table is changed from 2 to 0) so as to result in an output signal C1 of "0". The other set of input signals A2, B2 and an output signal C2 operate similarly, and thus a detailed description is deemed unnecessary. It is thus known that the programmable logic block 10 is capable of providing the function of two Muller-C elements by modifying the look-up tables.

Two-to-Four Phase Converter

Figure 7:
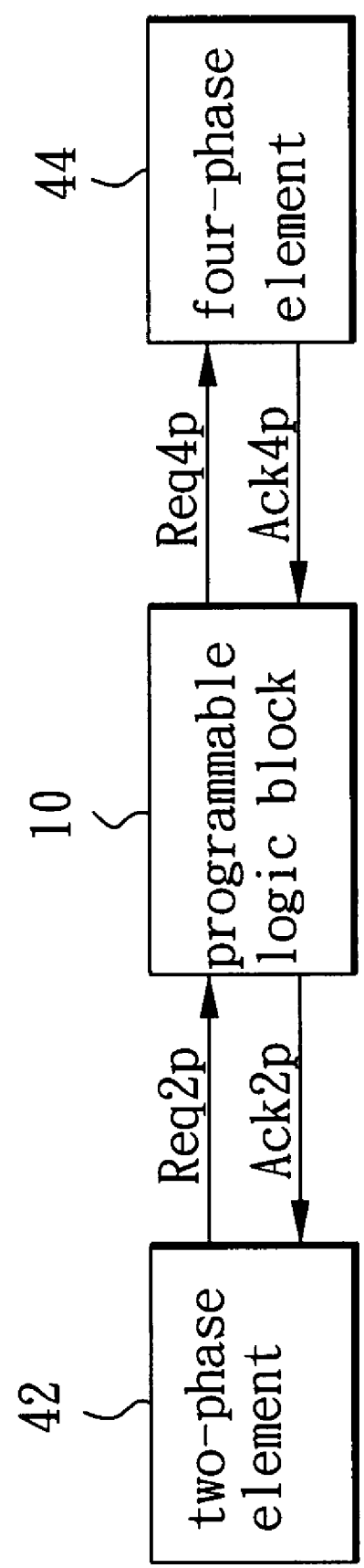
FIG. 7 is a schematic view illustrating the connection relationship among a logic block, a two-phase element and a four-phase element.

A two-to-four phase converter is provided to comply with a communication protocol of transmitting asynchronous signals by converting a two-phase protocol into a four-phase protocol. As shown in FIG. 7, it is necessary for asynchronous data to comply with the asynchronous data transmission protocol in the handshaking process. In general, the four-phase protocol is used. For example, a four-phase element 44 using the four-phase protocol requires stages of REQ enable, ACK enable, REQ disable and ACK disable, as opposed to the common two-phase protocol used for the asynchronous data handshake (e.g., a two-phase element 42 using the two-phase protocol). Hence, it is necessary for an asynchronous circuit design to have the two-to-four phase converter. When a programmable logic block 10 serves as the two-to-four phase converter, an input signal Req2$p$ and an output signal Ack2$p$ use the two-phase protocol while an input signal Ack4$p$ and an output signal Req4$p$ use the four-phase protocol.

Figure 8:
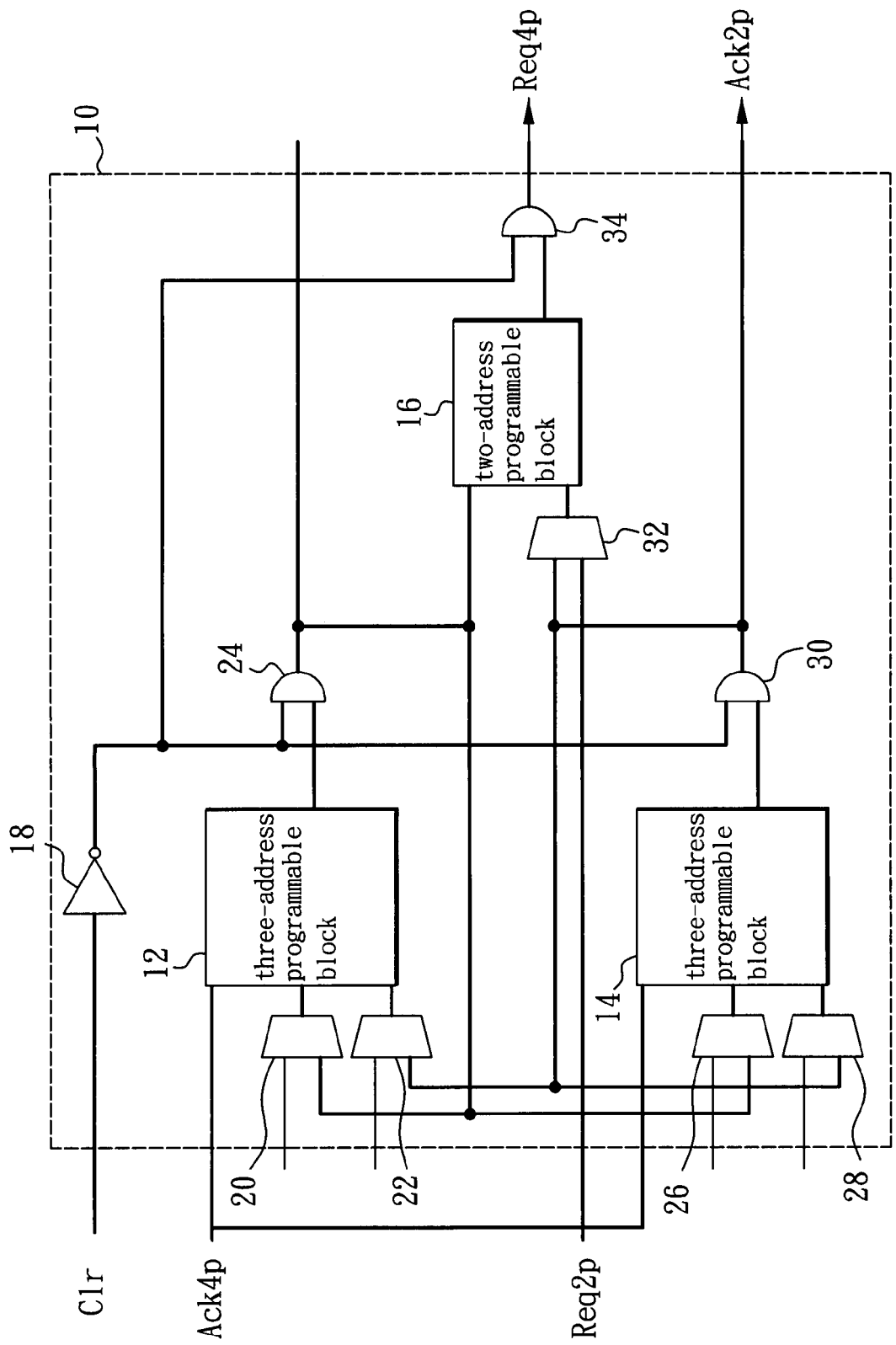
FIG. 8 is a schematic view of a programmable logic block having a two-to-four phase converter.

As shown in FIG. 8, when the programmable logic block 10 serves as the two-to-four phase converter, the contents of a first look-up table, a second look-up table and a third look-up table are as follows.

| Address | First look-up table | Second look-up table | Third look-up table |
| --- | --- | --- | --- |
| 0 | 0 | 0 | 0 |
| 1 | 1 | 0 | 1 |
| 2 | 1 | 1 | 1 |
| 3 | 1 | 0 | 0 |
| 4 | 0 | 0 | |
| 5 | 0 | 1 | |
| 6 | 1 | 1 | |
| 7 | 0 | 1 | |

On the other hand, the predetermined value of multiplexers 20, 22, 26, 28, and 32 are 1, 1, 1, 1 and 1, respectively. Circuit lines in bold are active wirings while circuit lines in fine are inactive wirings.

Figure 9:
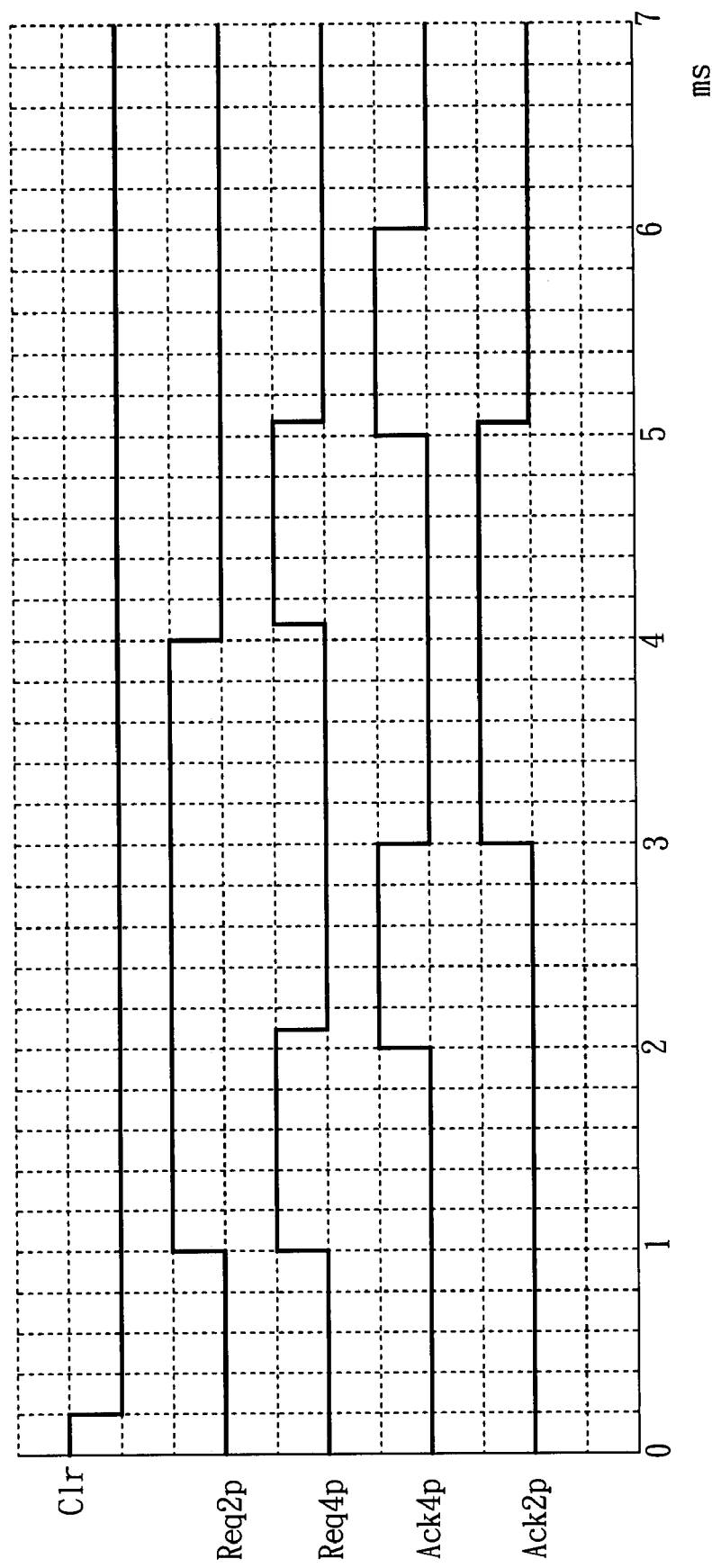
FIG. 9 is a timing diagram of the programmable logic block of FIG. 8.

FIG. 9 shows a timing diagram of this programmable logic block 10. During the first millisecond, due to the initialization, a two-phase element 42 brings about an input signal Req2$p$ of "1", an output of "0" from the three-address programmable block 12 (corresponding to address 0 of the look-up table), an output of "0" from the three-address programmable block 14 (corresponding to address 0 of the look-up table) and an output of "1" from the two-address programmable block 16 (corresponding to address 2 of the look-up table) so as to have an output signal Req4$p$ of "1" outputted to a four-phase element 44 and an output signal Ack2$p$ of "0" outputted to the two-phase element 42. During the second millisecond, the four-phase element 44 brings about an input signal Ack4$p$ of "1", an output of "1" from the three-address programmable block 12 (the corresponding address of the look-up table is changed from 1 to 3), an output of "0" from the three-address programmable block 14 (the corresponding address of the look-up table is changed from 1 to 3) and an output of "0" from the two-address programmable block 16 (corresponding to address 3 of the look-up table) so as to have an output signal Req4$p$ of "0"

outputted to the four-phase element 44 and an output signal Ack2p of "0" outputted to the two-phase element 42. During the third millisecond, the four-phase element 44 brings about an input signal Ack4p of "0", an output of "1" from the three-address programmable block 12 (the corresponding address of the look-up table is changed from 2 to 6), an output of "1" from the three-address programmable block 14 (the corresponding address of the look-up table is changed from 2 to 6) and an output of "0" from the two-address programmable block 16 (corresponding to address 3 of the look-up table) so as to have an output signal Req4p of "0" outputted to the four-phase element 44 and an output signal Ack2p of "1" outputted to the two-phase element 42. During the fourth millisecond, the two-phase element 42 brings about an input signal Req2p of "0" and an output of "1" from the two-address programmable block 16 (corresponding to address 1 of the look-up table) so as to have an output signal Req4p of "1" outputted to the four-phase element 44. During the fifth millisecond, the four-phase element 44 brings about an input signal Ack4p of "1", an output of "0" from the three-address programmable block 12 (the corresponding address of the look-up table is changed from 7 to 5), an output of "1" from the three-address programmable block 14 (the corresponding address of the look-up table is changed from 7 to 5) and an output of "0" from the two-address programmable block 16 (corresponding to address 0 of the look-up table) so as to have an output signal Req4p of "0" outputted to the four-phase element 44 and an output signal Ack2p of "1" outputted to the two-phase element 42. During the sixth millisecond, the four-phase element 44 brings about an input signal Ack4p of "0", an output of "0" from the three-address programmable block 12 (the corresponding address of the look-up table is changed from 4 to 0), an output of "0" from the three-address programmable block 14 (the corresponding address of the look-up table is changed from 4 to 0) and an output of "0" from the three-address programmable block 16 (corresponding to address 0 of the look-up table) so as to have an output signal Req4p of "0" outputted to the four-phase element 44 and an output signal Ack2p of "0" outputted to the two-phase element 42. Thus, it is known that the programmable logic block 10 is capable of performing the function of the two-to-four phase converter by modifying the look-up tables.

Four-to-Two Phase Converter

When a programmable logic block 10 serves as a four-to-two phase converter, the contents of a first look-up table, a second look-up table and a third look-up table are as follows.

| Address | First look-up table | Second look-up table | Third look-up table |
|---|---|---|---|
| 0 | 0 | 0 | 0 |
| 1 | 0 | 1 | 1 |
| 2 | 0 | 0 | 1 |
| 3 | 1 | 0 | 0 |
| 4 | 1 | 1 | |
| 5 | 0 | 1 | |
| 6 | 1 | 1 | |
| 7 | 1 | 0 | |

Figure 10:
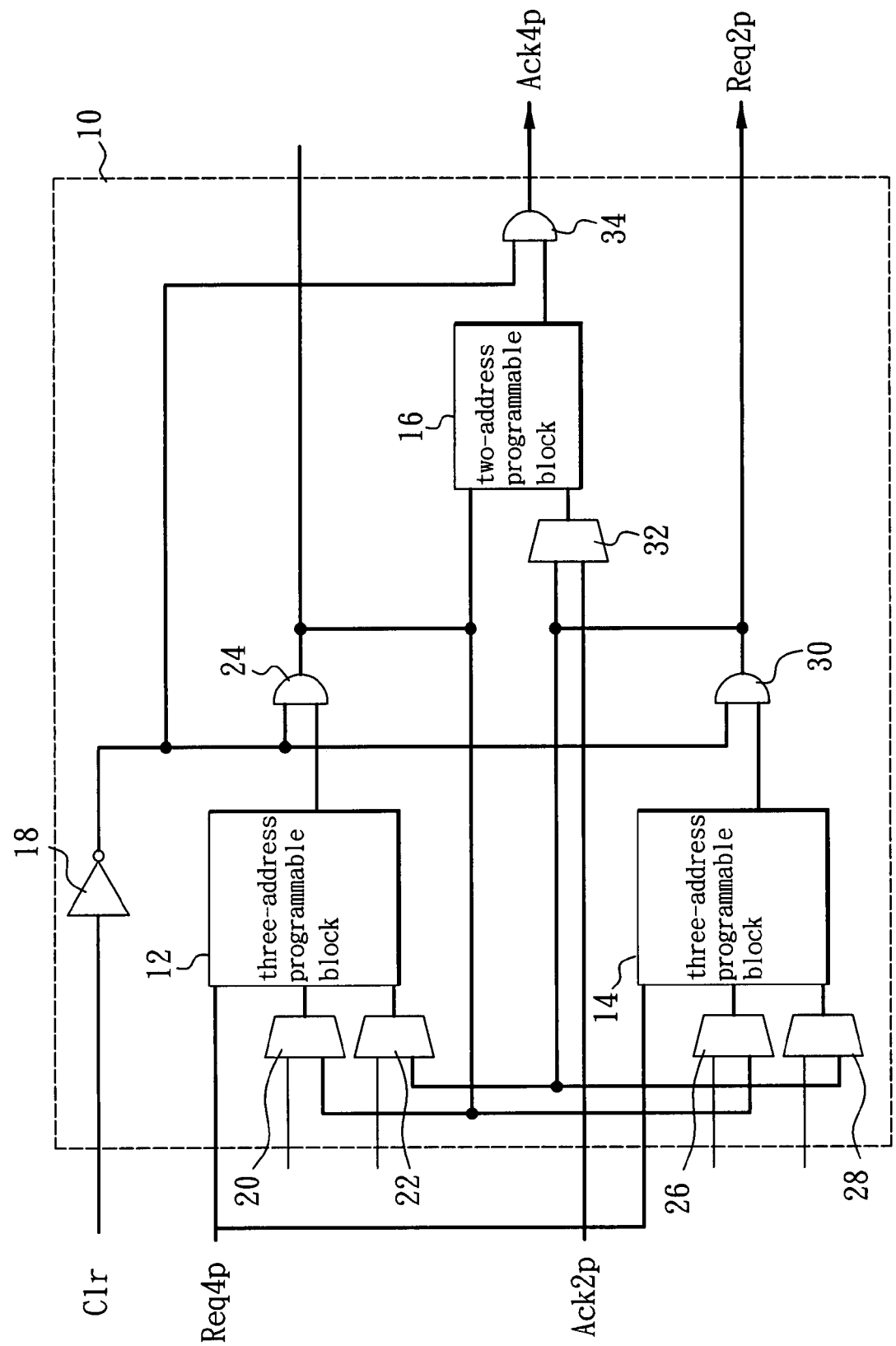
FIG. 10 is a schematic view of a logic block having a four-to-two phase converter.
Figure 11:
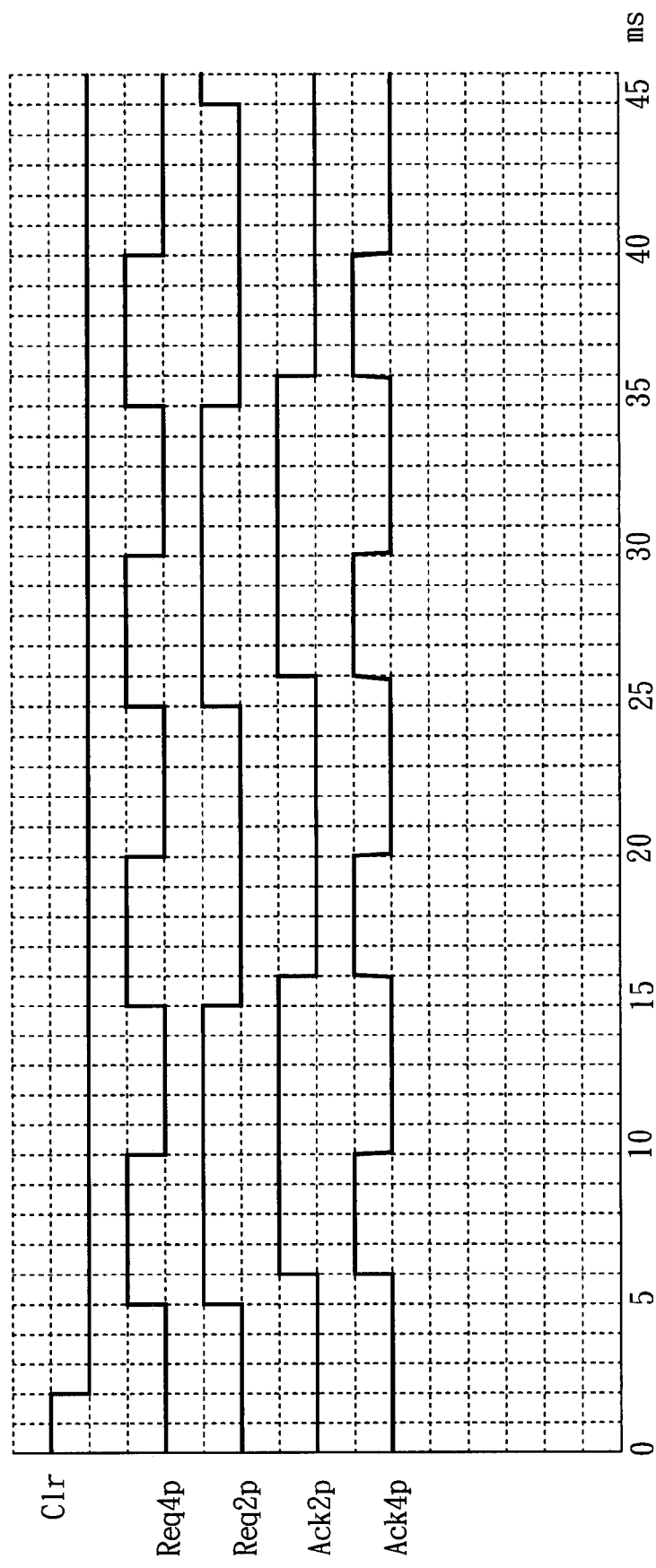
FIG. 11 is a timing diagram of the logic block of FIG. 10.

On the other hand, the predetermined value of multiplexers 20, 22, 26, 28, and 32 are 1, 1, 1, 1 and 1, respectively. Circuit lines in bold are active wirings while circuit lines in fine are inactive wirings, as shown in FIG. 10. FIG. 11 shows a timing diagram of this programmable logic block 10 that operates similarly to the two-to-four phase converter. The operation of the four-to-two converter is similar to that of the two-to-tour phase converter, and thus a detailed description is deemed unnecessary.

Condition Converter

Figure 12:
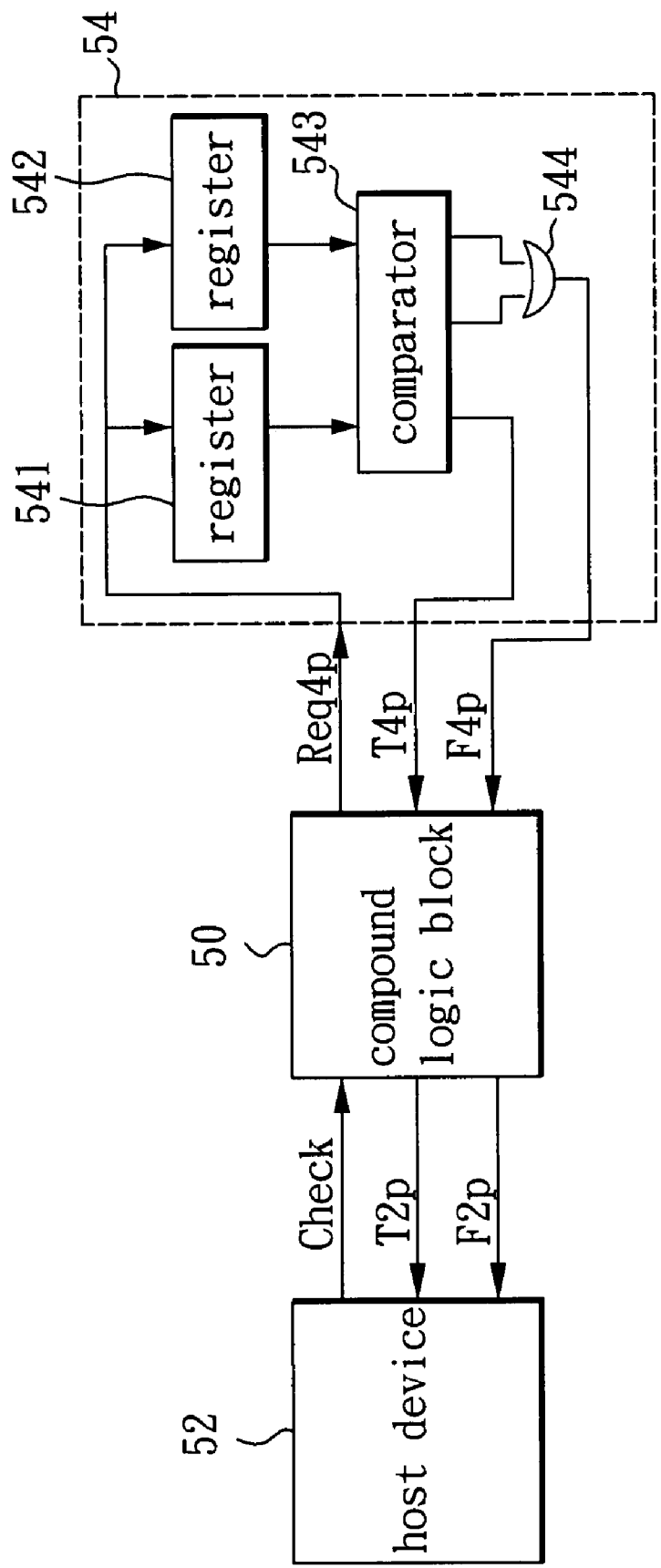
FIG. 12 is a schematic view illustrating the connection relationship among a compound logic block, a host device and a comparator.

The function of condition converter is to determine a conditional statement, for example, if A>B. As shown in FIG. 12, in the process of determining a condition, a host device 52 (using the two-phase protocol) outputs a check signal (high voltage level signal) to a compound logic block 50 (composed of a logic block 8 and a programmable logic block 10). The compound logic block 50 outputs a Req4p signal (high voltage level signal) to a register 541 and a register 542 (using the four-phase protocol) of a comparison circuit 54. The comparison circuit 54 comprises the register 541 (with a value A), the register 542 (with a value B), a comparator 543 and an OR gate 544. If the Req4p signal is a high voltage level signal, the values of the registers 541 and 542 are outputted to the comparator 543. The comparator 543 has three output ports to indicate three results of A>B, A=B and A<B. An output signal for the A>B port is connected to T4p signal, and then is transmitted to the compound logic block 50 so as to output T2p signal to the host device 52. A signal for the A=B port and the A<B port is calculated by means of the OR gate 544, and then is connected to F4p signal line so as to be transmitted back to the compound logic block 50. In this connection, if the comparison result is A>B, T4p signal is asserted (high voltage level signal); and if the comparison result is A=B or A<B, F4p signal is asserted (high voltage level signal).

When the compound logic block 50 receives either T4p or F4p of high voltage level signal, the output signal Req4p is regulated to a low level signal. Thus, the values outputted from the registers A and B to the comparison circuit 54 will be terminated. The comparison circuit 54 lacks input value for comparison. As a result, comparison results of the A>B port, the A=B port and the A<B port are all deleted to become outputs of low level signal.

At this moment, if the compound logic block 50 detects a change of T4p from a high level signal to a low level signal, the signal level of T2p to be outputted to the host device 52 is changed. If a change of F4p is detected from a high level signal to a low level signal, the signal level of F2p to be outputted to the host device 52 is changed.

Figure 13:
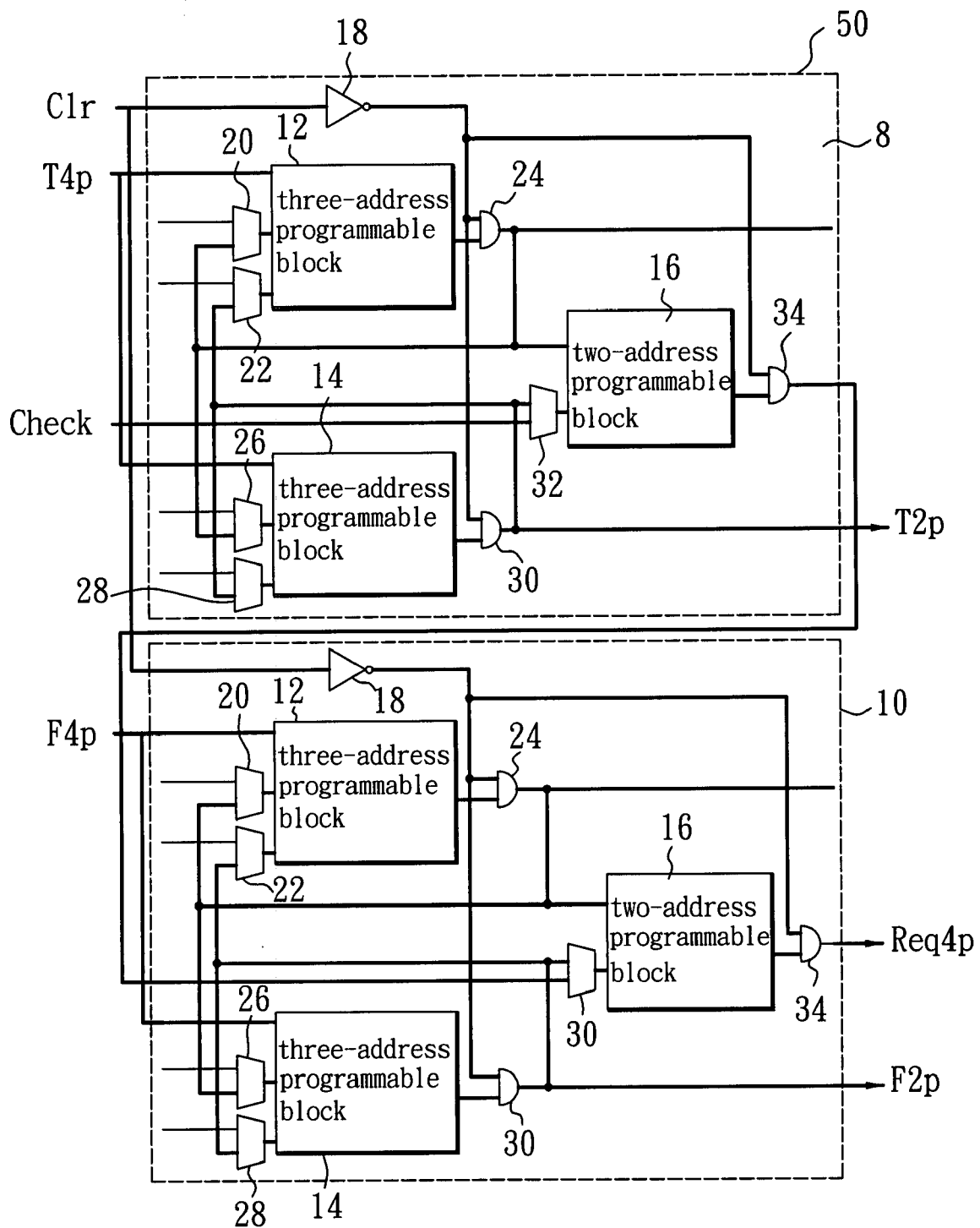
FIG. 13 is a schematic view of a compound of two programmable logic block as a condition converter.

As shown in FIG. 13, the compound logic block 50 is composed of the logic block 8 and the programmable logic block 10 both of which are the same device, except the contents of the first look-up table, the second look-up table and the third look-up table as well as the wirings. The contents of the first look-up table, the second look-up table and the third look-up table of the logic block 8 are as follows.

| Address | First look-up table | Second look-up table | Third look-up table |
|---|---|---|---|
| 0 | 0 | 0 | 0 |
| 1 | 1 | 0 | 1 |
| 2 | 1 | 1 | 1 |
| 3 | 1 | 0 | 0 |
| 4 | 0 | 0 | |
| 5 | 0 | 1 | |
| 6 | 1 | 1 | |
| 7 | 0 | 1 | |

On the other hand, the predetermined value of multiplexers 20, 22, 26, 28, and 32 of the logic block 8 are 1, 1, 1, 1 and 1, respectively. Circuit lines in bold are active wirings while circuit lines in fine are inactive wirings.

The contents of the first look-up table, the second look-up table and the third look-up table of the programmable logic block 10 are as follows.

| Address | First look-up table | Second look-up table | Third look-up table |
|---------|---------------------|----------------------|---------------------|
| 0 | 0 | 0 | 0 |
| 1 | 1 | 0 | 1 |
| 2 | 1 | 1 | 1 |
| 3 | 1 | 0 | 0 |
| 4 | 0 | 0 | |
| 5 | 0 | 1 | |
| 6 | 1 | 1 | |
| 7 | 0 | 1 | |

Figure 14:
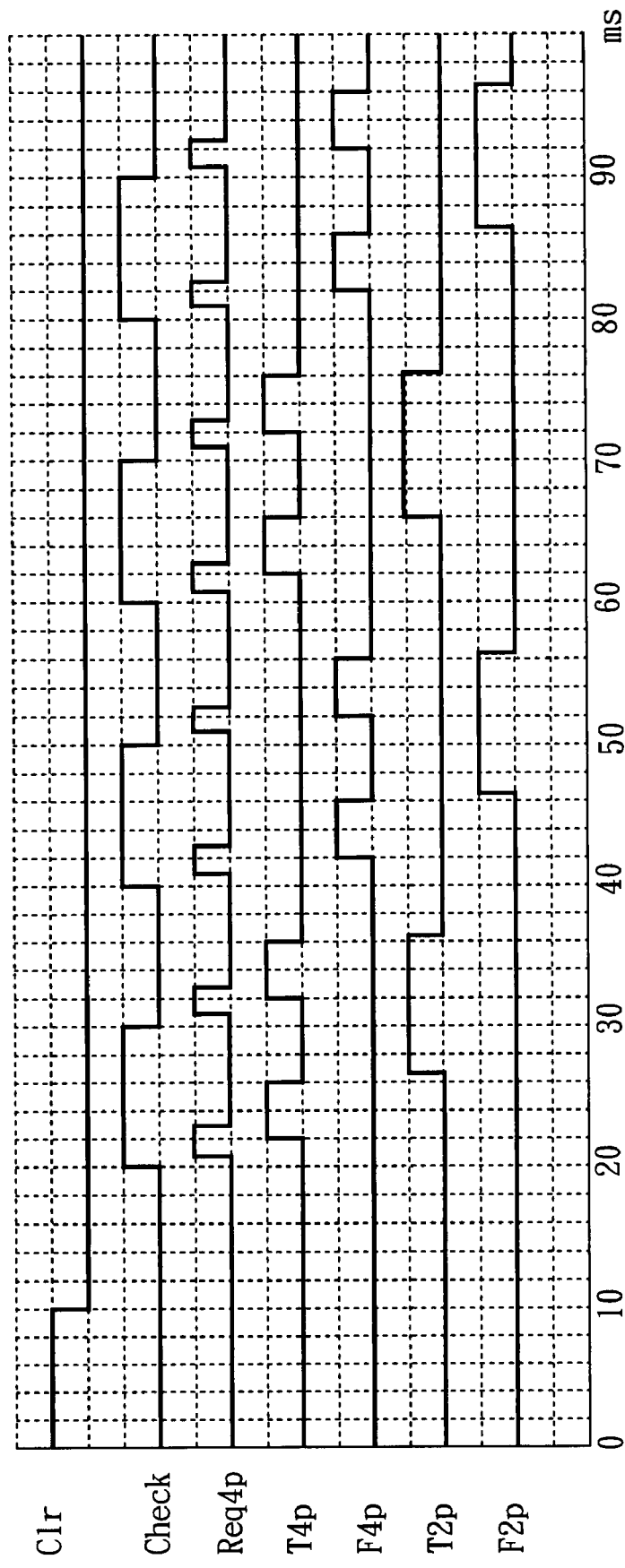
FIG. 14 is a timing diagram of the compound logic block of FIG. 13.

On the other hand, the predetermined value of multiplexers 20, 22, 26 28 and 32 of the programmable logic block 10 are 1, 1, 1, 1 and 1, respectively. Circuit lines in bold are active wirings while circuit lines in fine are inactive wirings FIG. 14 shows a timing diagram of this compound logic block 50. During the twentieth millisecond, there is a Check signal of "1" so as to have an output of "0" from a three-address programmable block 12 (corresponding to address 0 of the look-up table), an output of "0" from a three-address programmable block 14 (corresponding to address 0 of the look-up table) and an output of "1" from a two-address programmable block 16 (corresponding to address 2 of the look-up table) in the logic block 8. Also, there are an output of "0" from a three-address programmable block 12 (corresponding to address 0 of the look-up table), an output of "0" from a three-address programmable block 14 (corresponding to address 0 of the look-up table) and an output of "1" from a two-address programmable block 16 (corresponding to address 2 of the look-up table) in the programmable logic block 10. As a result, there is a Req 4p signal of "1" (occurring during the twenty-first millisecond).

During the twenty-second millisecond, there is a T4p signal of "1" so as to have an output of "1" from the three-address programmable block 12 (the corresponding address of the look-up table is changed from 1 to 3), an output of "0" from the three-address programmable block 14 (the corresponding address of the look-up table is changed from 1 to 3) and an output of "0" from the two-address programmable block 16 (corresponding to address 3 of the look-up table) in the logic block 8, and have an output of "0" from the three-address programmable block 12 (corresponding to address 0 of the look-up table), an output of "0" from the three-address programmable block 14 (corresponding to address 0 of the look-up table) and an output of "0" from the two-address programmable block 16 (corresponding to address 0 of the look-up table) in the programmable logic block 10. As a result, there is a Req4p signal of "0" (occurring during the twenty-third millisecond).

During the twenty-sixth millisecond, there is a T4p signal of "0" so as to have an output of "1" from the three-address programmable block 12 (the corresponding address of the look-up table is changed from 2 to 6) and an output of "1" from the three-address programmable block 14 (the corresponding address of the look-up table is changed from 2 to 6) in the logic block 8. As a result, there are a T2p signal of "1" and an output of "0" from the two-address programmable block 16 (corresponding to address 3 of the look-up table).

During the thirtieth millisecond, there is a check signal of "1" so as to have an output of "1" from the three-address programmable block 12 (corresponding address 6 the look-up table), an output of "1" from the three-address programmable block 14 (corresponding to address 6 of the look-up table) and an output of "1" from the two-address programmable block 16 (corresponding to address 1 of the look-up table) in the logic block 8, and have an output of "0" from the three-address programmable block 12 (corresponding to address 0 of the look-up table), an output of "0" from the three-address programmable block 14 (corresponding to address 0 of the look-up table) and an output of "1" from the two-address programmable block 16 (corresponding to address 2 of the look-up table) in the programmable logic block 10. As a result, there is a Req4p signal of "1" (occurring during the thirty-first millisecond).

During the thirty-second millisecond, there is a T4p signal of "1" so as to have an output of "0" from the three-address programmable block 12 (the corresponding address of the look-up table is changed from 7 to 5), an output of "1" from the three-address programmable block 14 (the corresponding address of the look-up table is changed from 7 to 5) and an output of "0" from the two-address programmable block 16 (corresponding to address 0 of the look-up table) in the logic block 8, and have an output of "0" from the three-address programmable block 12 (corresponding to address 0 of the look-up table), an output of "0" from the three-address programmable block 14 (corresponding to address 0 of the look-up table) and an output of "0" from the two-address programmable block 16 (corresponding to address 0 of the look-up table) in the programmable logic block 10. As a result, there is a Req4p signal of "0" (occurring during the thirty-third millisecond).

During the thirty-sixth millisecond, there is a T4p signal of "0" so as to have an output of "0" from the three-address programmable block 12 (the corresponding address of the look-up table is changed from 4 to 0) and an output of "0" from the three-address programmable block 14 (the corresponding address is changed from 4 to 0) in the logic block 8. As a result, there are a T2p signal of "0" and an output of "0" from the two-address programmable block 16 (corresponding to address 0 of the look-up table); and so on. Thus, it is known that the compound logic block 50 is capable of performing the functions of the condition converter by modifying the look-up tables.

In summary, the programmable logic block 10 can provide the user with a circuit of any specific function by modifying the first look-up table, the second look-up table and the third look-up table as well as the predetermined values of the multiplexers 20, 22, 26, 28 and 32. Moreover, two or more logic blocks 10 can be combined; for example, the compound logic block 50 is provided to have a complex circuit of any specific function. Hence, the programmable logic block 10 is capable of achieving the object of the present invention.

Although the present invention has been explained in relation to its preferred embodiments, it is to be understood that many other possible modifications and variations can be made without departing from the scope of the invention as hereinafter claimed.

What is claimed is:

1. A programmable logic block performing a predetermined logic processing function based on a set of external input signals and then outputting a set of external output signals, the programmable logic block comprising:

a first programmable logic block outputting a first output signal in accordance with a first look-up table and a set of first input signals;

a second programmable logic block outputting a second output signal in accordance with a second look-up table and a set of second input signals;

an inverter for receiving an external trigger signal and outputting an inverted signal;

a first logic AND gate for receiving the first output signal and the inverted signal and outputting a first feedback signal;

a second logic AND gate for receiving the second output signal and the inverted signal and outputting a second feedback signal;

a first multiplexer for receiving the first feedback signal or a first external input signal and outputting a first input signal;

a second multiplexer for receiving the second feedback signal or a second external input signal and outputting another first input signal;

a third multiplexer for receiving the first feedback signal or a third external input signal and outputting a second input signal; and a fourth multiplexer for receiving the second feedback signal or a fourth external input signal and outputting another second input signal;

wherein the first to the fourth external input signals for the first to the fourth multiplexers respectively are selected from the set of the external input signals in accordance with a set of predetermined signals, and the first and the second feedback signals are, respectively, external output signals.

2. The programmable logic block of claim 1, wherein the predetermined logic processing function of a toggle element is performed based on the first look-up table and the second look-up table when the set of predetermined signals is set to a form of 1, 1, 1, and 1.

3. The programmable logic block of claim 2, wherein the toggle element is implemented and active when the first programmable logic block has a first input terminal connected to a first external input terminal, a second input terminal connected to an output terminal of the first multiplexer and a third input terminal connected to an output terminal of the second multiplexer, the second programmable logic block has a first input terminal connected to the first external input terminal, a second input terminal connected to an output terminal of the third multiplexer and a third input terminal connected to an output terminal of the fourth multiplexer, the inverter has an input terminal connected to an external trigger terminal and an output terminal connected to first input terminals of the first and second AND gates, the first AND gate further has a second input terminal connected to an output terminal of the first programmable logic block and an output terminal connected to internal input terminals of the first and third multiplexers and a first external output terminal, and the second AND gate further has a second input terminal connected to an output terminal of the second programmable logic block and an output terminal connected to internal input terminals of the second and fourth multiplexers and a second external output terminal, in which the toggle element is initialized by receiving the external trigger signal from the external trigger terminal to the inverter and then receives the set of external input signals, which are a same external input signal, from the first external input terminal to the first input terminals of the first and second programmable logic blocks for accordingly performing the predetermined logic processing function.

4. The programmable logic block of claim 1, wherein the first programmable block comprises an internal multiplexer for outputting the first output signal corresponding to the set of first input signals in accordance with the first look-up table.

5. The programmable logic block of claim 4, wherein the first programmable block is a three-address programmable block.

6. The programmable logic block of claim 1, wherein the second programmable block comprises an internal multiplexer for outputting the second output signal corresponding to the set of second input signals in accordance with the second look-up table.

7. The programmable logic block of claim 6, wherein the second programmable block is a three-address programmable block.

8. The programmable logic block of claim 1, wherein the first look-up table and the second look-up table are stored in a memory.

9. The programmable logic block of claim 8, wherein the memory is a SRAM.

10. The programmable logic block of claim 8, wherein the memory is a flash memory.

11. The programmable logic block of claim 1, wherein the predetermined logic processing function of two independent Muller-C toggle elements is performed based on the first look-up table and the second look-up table when the set of predetermined signals is set to a form of 1, 0, 0, and 1.

12. The programmable logic block of claim 11, wherein the two independent Muller-C elements are implemented and active when the first programmable logic block has a first input terminal connected to a first external input terminal, a second input terminal connected to an output terminal of the first multiplexer and a third input terminal connected to an output terminal of the second multiplexer, the second programmable logic block has a first input terminal connected to a third external input terminal, a second input terminal connected to an output terminal of the third multiplexer and a third input terminal connected to an output terminal of the fourth multiplexer, the inverter has an input terminal connected to an external trigger terminal and an output terminal connected to first input terminals of the first and second AND gates, the first AND gate further has a second input terminal connected to an output terminal of the first programmable logic block and an output terminal connected to an internal input terminal of the first multiplexer and a first external output terminal, the second AND gate further has a second input terminal connected to an output terminal of the second programmable logic block and an output terminal connected to an internal input terminal of the fourth multiplexer and a second external output terminal, the second multiplexer has an external input terminal connected to a second external input terminal, and the third multiplexer has an external input terminal connected to a fourth external input terminal, in which the two Muller-C elements are initialized by receiving the external trigger signal from the external trigger terminal to the inverter and then receives the set of external input signals through the first to the fourth external input terminals for accordingly performing the predetermined logic processing function.

13. The programmable logic block of claim 1, further comprising a fifth multiplexer for receiving the second feedback signal and a fifth external input signal which is selected from the set of the external input signals in accordance with the set of predetermined signals and outputting a third input signal, a two-address programmable block receiving the first feedback signal and the third input signal and accordingly outputting a third output signal in accordance with a third look-up table, and a third logic AND gate for receiving the inverted signal and the third output signal and outputting an external output signal other than the first and the second feedback signals in order to perform the predetermined logic processing functions of a phase converter based on the first to the third look-up tables when the set of predetermined signals is set to a form of 1, 1, 1, 1, and 1.

14. The programmable logic block of claim 13, wherein the phase converter is implemented and active when the first programmable logic block has a first input terminal connected to a first external input terminal, a second input terminal connected to an output terminal of the first multiplexer and a third input terminal connected to an output terminal of the second multiplexer, the second programmable logic block has a first input terminal connected to the first external input terminal, a second input terminal connected to an output terminal of the third multiplexer and a third input terminal connected to an output terminal of the fourth multiplexer, the inverter has an input terminal connected to an external trigger terminal and an output terminal connected to first input terminals of the first and second logic AND gates, the first logic AND gate further has a second input terminal connected to an output terminal of the first programmable logic block and an output terminal connected to internal input terminals of the first and third multiplexers and a first external output terminal, the second logic AND gate further has a second input terminal connected to an output terminal of the second programmable logic block and an output terminal connected to internal input terminals of the second and fourth multiplexers and a second external output terminal, the fifth multiplexer has an external input terminal connected to a second external input terminal, an internal input terminal connected to the output terminal of the second logic AND gate, the two-address programmable block has a first input terminal connected to the output terminal of the first logic AND gate and the internal input terminals of the second and the third multiplexers and a second input terminal connected to an output terminal of the fifth multiplexer, and the third logic AND gate has a first input terminal connected to the output terminal of the inverter and the first input terminal of the first logic AND gate, a second input terminal connected to an output of the two-address programmable block and an output terminal connected to a third external output terminal, in which the phase converter is initialized by receiving the external trigger signal from the external trigger terminal to the inverter and then receives a same external input signal from the first external input terminal to the first input terminals of the first and second programmable logic blocks and a different external input signal from the second external input terminal to the external input terminal of the fifth multiplexer for accordingly performing the predetermined logic processing function.

15. The programmable logic block of claim 14, wherein two phase converters are connected in series by connecting the third external output terminal of a first phase converter to the second external input terminal of a second phase converter to provide a compound logic block for performing the predetermined logic processing function of a condition converter.

16. The programmable logic block of claim 1, wherein the programmable logic block is an asynchronous electronic device.

17. The programmable logic block of claim 14, wherein the phase converter is a two-to-four phase converter when the same external input signal and corresponding external output signal at the third external output terminal use a four-phase protocol and the different external input signal and corresponding external output signal at the second external output terminal use a two-phase protocol, and conversely a four-to-two phase converter.

18. The programmable logic block of claim 15, wherein the condition converter further comprises a host device connected to the compound logic block for sending a check signal as the different external input signal to the first phase converter of the compound logic block and receiving output signals respectively of the second logic AND gates of the compound logic block, and a comparison circuit having two buffers to receive an output signal of the third logic AND gate of the second phase converter of the compound logic block and a comparator connected to the two buffers for a comparison.

* * * * *